(12) United States Patent
Chamoun et al.

(10) Patent No.: US 11,796,584 B2
(45) Date of Patent: Oct. 24, 2023

(54) PARTIAL DISCHARGE DETECTION SYSTEM AND METHOD

(71) Applicant: Palo Alto Research Center Incorporated, Palo Alto, CA (US)

(72) Inventors: Jacob N. Chamoun, Somerville, MA (US); Peter Kiesel, Palo Alto, CA (US); Saman Mostafavi, Charlotte, NC (US); Qiushu Chen, San Jose, CA (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 17/567,538

(22) Filed: Jan. 3, 2022

(65) Prior Publication Data
US 2023/0213570 A1    Jul. 6, 2023

(51) Int. Cl.
G01R 31/08    (2020.01)
G01R 31/12    (2020.01)
G02B 6/42     (2006.01)

(52) U.S. Cl.
CPC ....... G01R 31/1218 (2013.01); G02B 6/4286 (2013.01)

(58) Field of Classification Search
CPC ............ G01R 31/1209; G01R 31/1218; G01R 31/1227; G01R 31/1272; G01R 31/1245; G01R 31/1254; G01R 31/1263; G01R 31/081; G01R 31/083; G01R 31/52; G01R 31/58; G01R 31/62
See application file for complete search history.

(56) References Cited

U.S. PATENT DOCUMENTS

| 8,040,517 B1* | 10/2011 | Wu ...................... H02H 1/0023 356/432 |
| 8,054,594 B2* | 11/2011 | Wu ...................... H02H 1/0023 361/42 |
| 11,067,610 B2 | 7/2021 | Karin et al. |

(Continued)

OTHER PUBLICATIONS

Siegel et al., "Calibration Proposal for UHF Partial Discharge Measurements at Power Transformers," Energies, 2019;12; 3058: 17 pgs.

(Continued)

*Primary Examiner* — Thang X Le
(74) *Attorney, Agent, or Firm* — Mueting Raasch Group

(57) ABSTRACT

A system for evaluating a high voltage asset (HV asset) comprises a PD detector disposed in the HV asset. The PD detector comprises an electrical coupler configured to couple electrical disturbances indicative of a partial discharge from a high voltage conductor of the HV asset to an electrical-to-optical converter. The electrical-to-optical converter comprises a light emitter, and is configured to convert the electrical disturbances to a light signal. An optical power receiver is disposed in the high voltage asset and coupled to the PD detector. The optical power receiver is configured to receive optical power from an external optical power source via a non-conducting optical fiber arrangement. The electrical-to-optical converter is configured to communicate the light signal indicative of the partial discharge to an electronic device external of high voltage asset via the non-conducting optical fiber arrangement.

26 Claims, 12 Drawing Sheets

(56) References Cited

U.S. PATENT DOCUMENTS

| | | | | |
|---|---|---|---|---|
| 2010/0328824 | A1* | 12/2010 | Roscoe | H02H 1/0023 |
| | | | | 324/536 |
| 2010/0332161 | A1* | 12/2010 | Bulumulla | G01R 31/008 |
| | | | | 702/58 |
| 2016/0139196 | A1* | 5/2016 | Hoff | G01R 31/58 |
| | | | | 356/73.1 |
| 2017/0138999 | A1* | 5/2017 | Kim | G01R 31/1272 |
| 2019/0056447 | A1* | 2/2019 | Candela | G01R 31/08 |
| 2020/0209288 | A1 | 7/2020 | Karin et al. | |
| 2020/0209301 | A1 | 7/2020 | Karin et al. | |
| 2020/0322054 | A1* | 10/2020 | Bai | G09G 5/006 |
| 2021/0123966 | A1 | 4/2021 | Karin et al. | |
| 2021/0148735 | A1* | 5/2021 | Jiang | G01D 5/35325 |

OTHER PUBLICATIONS

Rosolem et al., "A Fiber Optic Powered Sensor Designed for Partial discharges Monitoring on High Voltage Bushings," 2015 SBMO/IEEE MTT-S International Microware and Optoelectronics Conference (IMOC); Nov. 3-6, 2015: 5 pgs.

Rosolem et al., "Field and Laboratory Demonstration of a Fiber-Optic/RF Partial Discharges Monitoring System for Hydrogenerators Applications," IEEE Transactions on Energy Conversion, Sep. 2010; 25(3): 884-890.

Niasar, Mohamad Ghaffarian, "Partial Discharge Signatures of Defects in Insulation Systems Consisting of Oil and Oil-impregnated Paper," KTH Electrical Engineering Licentiate Thesis, Stockholm Sweden, 2012: 77 pgs.

"PoF Smart Monitoring System" MH GoPower [online] www.mhgopower.com/laser_pof_POF-EL240.html;Oct. 14, 2020: 2 pgs.

Li et al., "A Novel Partial Discharge Localization Method in Substation based on a Wireless UHF Sensor Array," Sensors, 2017;17;1909:18 pgs.

Hoek et al., "Localizing Partial Discharge IN Power transformers by Combining Acoustic and Different Electrical Methods," 2021 IEEE International Symposium on Electrical Insulation, San Juan Puerto Rico, USA, Jul. 30, 2012: 5 pgs.

Gao et al., "Partial Discharge Localization Inside transformer Windings via Fiber-Optic Acoustic Sensor Array," IEE Transactions on Power Delivery, Aug. 2019;34(4): 1251-1260.

Bassan et al., "Power-over-Fiber LPIT for Voltage and Current Measurements in the Medium Voltage Distribution Networks," Sensors, 2021;21:547: 24 pgs.

* cited by examiner

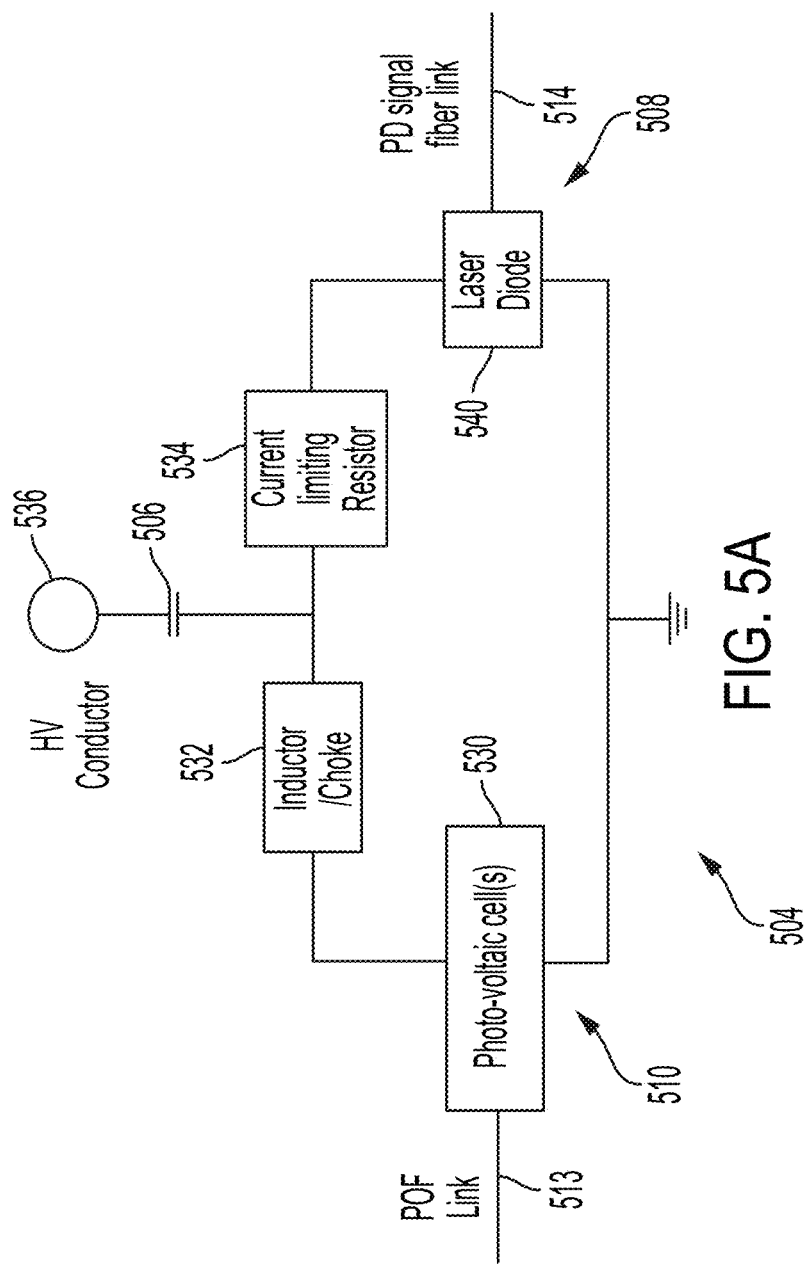

PARTIAL DISCHARGE DETECTION SYSTEM AND METHOD

BACKGROUND

A partial discharge (PD) is a small electrical spark occurring in the insulation or near an electrode of an electrical device. Arcing can be considered a form of partial discharge or a precursor to a PD, and involves a discharge reaching from one conductor to another or to ground. Arcing discharge can be considered a prolonged electrical discharge produced by an electrical breakdown of a gas. Partial discharge monitoring can be an important tool to detect degradation of electrical devices. The presence of PD can signify insulation degradation, loose connections, moisture ingress, high voltage in unintended locations, or other issues.

BRIEF SUMMARY

Some embodiments are directed to a system for evaluating a high voltage asset (HV asset). The system comprises a PD detector disposed in the HV asset. The PD detector comprises an electrical coupler configured to couple electrical disturbances indicative of a partial discharge from a high voltage conductor of the HV asset to an electrical-to-optical converter. The electrical-to-optical converter comprises a light emitter, and is configured to convert the electrical disturbances to a light signal. An optical power receiver is disposed in the high voltage asset and coupled to the PD detector. The optical power receiver is configured to receive optical power from an external optical power source via a non-conducting optical fiber arrangement. The electrical-to-optical converter is configured to communicate the light signal indicative of the partial discharge to an electronic device external of high voltage asset via the non-conducting optical fiber arrangement.

Some embodiments are directed to a system for evaluating a high voltage asset comprising a PD detector disposed in the HV asset. The PD detector comprises an electrical coupler configured to couple electrical disturbances indicative of a partial discharge from a high voltage conductor of the HV asset to an electrical-to-optical converter. The electrical-to-optical converter comprises a light emitter, and is configured to convert the electrical disturbances to a light signal. A power source is disposed in the HV asset and coupled to the PD detector. The power source is devoid of an electrical conductor that extends out of the HV asset. In some embodiments, the power source comprises an energy harvesting arrangement configured to harvest energy from the HV asset itself. The electrical-to-optical converter is configured to communicate the light signal indicative of the partial discharge to an electronic device external of HV asset via a non-conducting optical fiber arrangement.

Some embodiments are directed to a method for use with an HV asset. The method comprises supplying, via a source external of the HV asset and a non-conducting optical fiber arrangement, optical power to a PD detector disclosed in the HV asset. The method comprises converting, within the HV asset, the optical power to a DC voltage. The method also comprises continuously biasing a light emitter of the PD detector above a threshold value (of current or voltage) using the DC voltage. This method provides for detection of positive and negative voltage fluctuations as well as using light sources with a threshold characteristics like laser diodes. The method comprises coupling electrical disturbances indicative of a partial discharge from a high voltage conductor of the HA asset to the PD detector. The method further comprises generating, by the light emitter, a light signal indicative of the partial discharge, and communicating the light signal to an electronic device external of HV asset via the non-conducting optical fiber arrangement.

The above summary is not intended to describe each disclosed embodiment or every implementation of the present disclosure. The figures and the detailed description below more particularly exemplify illustrative embodiments.

BRIEF DESCRIPTION OF DRAWINGS

FIG. 5A illustrates details of a PD detector in accordance with various embodiments;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Figure 1:
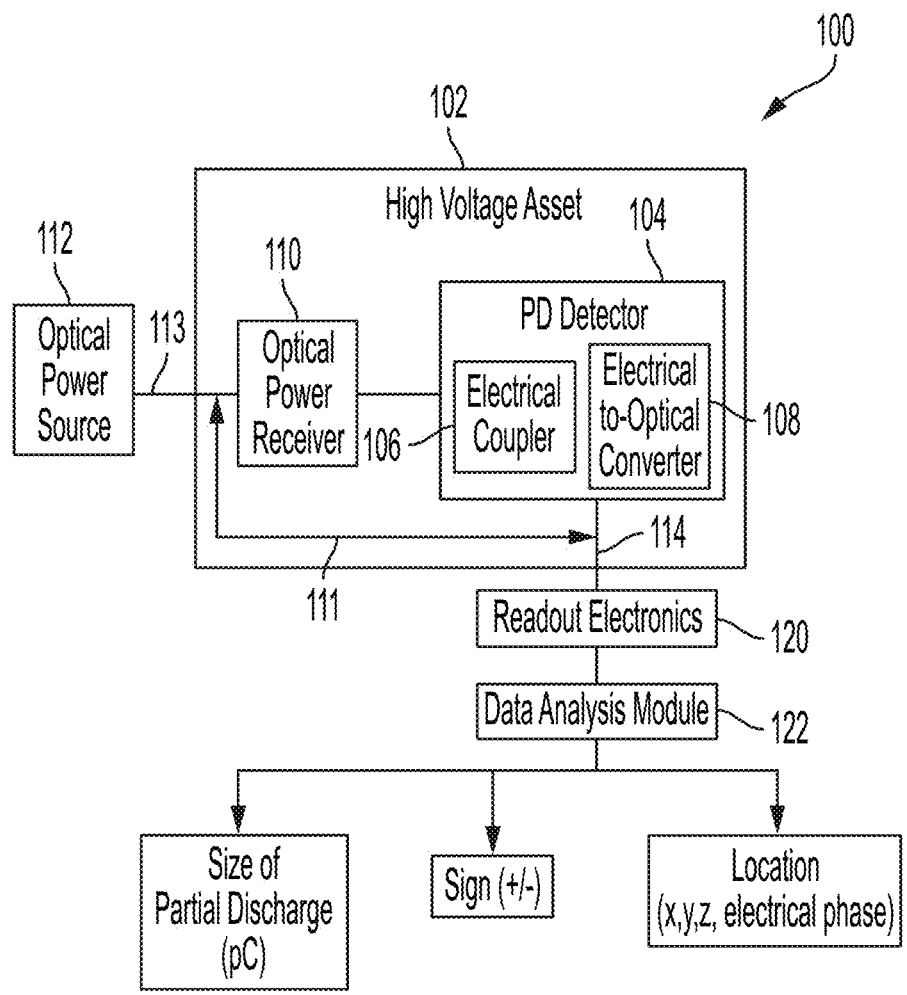
FIG. 1 illustrates a system for evaluating a high-voltage asset in accordance with various embodiments.

High voltage (HV) assets such as transformers, voltage regulators, switchgears, circuit breakers, and HV cables are a critical part of the power generation and distribution infrastructure. These structures can cost millions of dollars and have operating lifetimes of >25 years, which makes monitoring essential and cost-effective. In an HV system, a PD occurs when a defect in solid insulation such as a gas bubble causes a localized potential buildup. This energy is released in a short burst of current, which damages the insulation. Without interventions, the PD progressively degrades the insulation until a catastrophic arc occurs, leading to failure.

PDs can be precursors of arcing events and require higher detection sensitivity. Arcing events can saturate a conventional detection system that is designed for PD measurements. Through deployment of multiple sensor nodes and data analysis, embodiments of the disclosure can differentiate large PDs and actual arcing events (e.g., signal frequency, spatial feature, etc.). It is understood that arcing, especially inside a transformer, is a catastrophic failure and can immediately cause significant problems (e.g., explosion) once it is onset, whereas a PD may be less of a concern or can bear longer reaction time. It is understood that the term PD used herein refers to partial discharge events and arcing events. For convenience, partial discharge and arcing events will be referred to interchangeably as PD events in the following discussion.

Partial discharge sources may be difficult to detect via external inspection. For example, PD-induced pinholes in the solid insulation of a high voltage conductor initiate close to the conductor, making them invisible to the outside. A spatial localization of the PD source can suggest targeted interventions such as replacing insulation (e.g., oil in an oil-filled HV asset) or replacing a bushing or cable. However, existing methods based on the magnitude, frequency, phase distribution, and temporal shape of PD activity provide only a partial localization of the PD source based on comparing the observed PD with empirically cataloged PD patterns.

Embodiments of the disclosure are directed to quantifying and localizing PD events inside HV assets. Embodiments are directed to a PD detection system comprising a PD detector disposed within a HV asset. In some embodiments, the PD detector is powered by an optical power receiver configured to receive optical power supplied from an optical power source external to the HV asset via a fiber optic link. In other embodiments, the PD detector is powered by an energy harvesting arrangement disposed in the HV asset and coupled to the PD detector.

The PD detector includes a light emitter which is biased for continuous light output, and is configured to produce a light signal which is modulated by PD events occurring within the HV asset. The light signal is communicated from the PD detector to an external electronic system via a fiber optic link. As such, the PD detector system is devoid of electrical conductors (e.g., wire conductors) that would otherwise extend between the PD detector and external components of the system. It is understood that running electrical cables from the outside of the HV asset is not a viable option, as the inside of the HV asset must be galvanically isolated from ground. Deploying a multiplicity of PD detectors within a high voltage asset provides for localization of PD events. The PD detectors can be located anywhere inside the HV asset, which makes the PD detectors more sensitive and easier to calibrate because there is less screening from internal components and the walls of the HV asset. In some embodiments, one or more additional PD detectors are disposed outside of the HV asset, providing for localization of PD event inside and outside of the HV asset.

FIG. 1 illustrates a system for evaluating a high-voltage asset in accordance with various embodiments. The system 100 includes a PD detector 104 disposed inside a high-voltage asset 102. The high-voltage asset 102 can be any type of system which includes high-voltage conductors or elements, such as transformers, voltage regulators, switchgears, and circuit breakers. The PD detector 104 includes an electrical coupler 106 and an electrical-to-optical converter 108. The electrical coupler 106 is configured to couple electrical disturbances indicative of a partial discharge from a high-voltage conductor of the high-voltage asset 102 to the electrical-to-optical converter 108. The coupling strength and directionality can be chosen based on the placement and shape of the electrical coupler 106. The electrical-to-optical converter 108 includes a light emitter and is configured to convert the electrical disturbances to a light signal. The light emitter can be a solid-state light emitter or any light source. For example, the light emitter can be an LED, a laser diode or other laser source, or a superluminescent source, for example.

The system 100 also includes an optical power receiver 110 disposed inside the high-voltage asset. The optical power receiver 110 is respectively coupled to the PD detector 104 and to a non-conducting fiber optic arrangement 111. For convenience, the non-conducting fiber optic arrangement 111 will be described as including a first optical fiber 113 and a second optical fiber 114, it being understood that a common optical fiber link can constitute the non-conducting fiber optic arrangement 111. At least a portion of the non-conducting fiber optic arrangement 111 (e.g., the first optical fiber 113) extends out of the high-voltage asset 102. The non-conducting fiber optic arrangement 111 is also coupled to the PD detector 104. At least a portion of the non-conducting fiber optic arrangement 111 (e.g., the second optical fiber 114) extends out of the high-voltage asset 102. The non-conducting fiber optic arrangement 111 (e.g., the first and second optical fibers 113, 114) can be implemented as a single mode or multiple mode optical fiber arrangement.

The non-conducting fiber optic arrangement 111 (e.g., the second optical fiber 114) is communicatively coupled to the electrical-to-optical converter 108 and configured to communicate the light signal indicative of a partial discharge to an electronic device external of the high-voltage asset 102. For example, the external electronic device can include readout electronics 120 and a data analysis module 122. The electrical-to-optical converter 108 can include an encoder configured to encode the electrical disturbances indicative of the partial discharge on the light signal in an analog format or a digital format. The data analysis module 122 is configured to analyze the partial discharge data generated by the readout electronics 120 for purposes of detecting a partial discharge and for producing various types of data concerning a detected partial discharge. For example, the data analysis module 122 can be configured to generate data concerning the size of a partial discharge, the sign (+/−) of a partial discharge, and/or the location of the partial discharge. The location of the partial discharge can include, for example, the location in Cartesian coordinates (e.g., x, y, z location) and the electrical phase.

Figure 2:
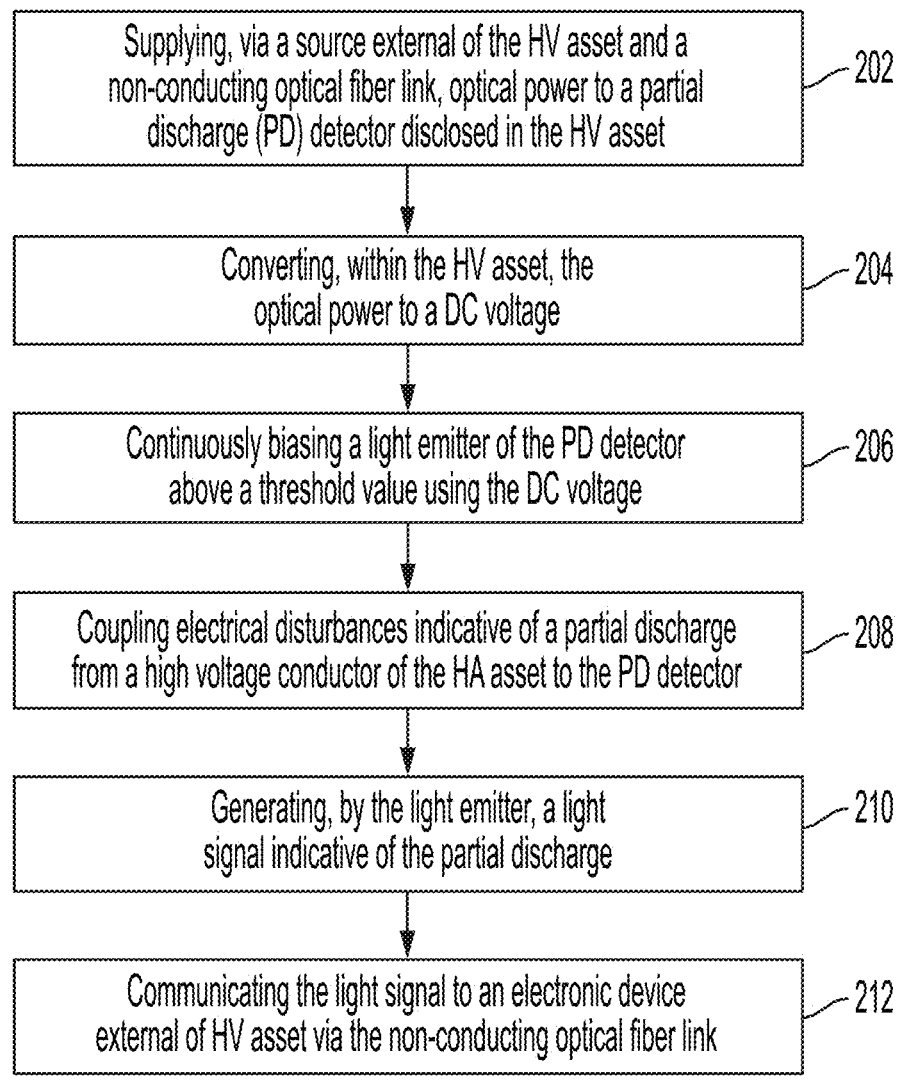
FIG. 2 illustrates a method of detecting a partial discharge from within a high-voltage asset in accordance with various embodiments.

FIG. 2 illustrates a method of detecting a partial discharge from within a high-voltage asset in accordance with various embodiments. The method shown in FIG. 2 can be implemented by the system 100 shown in FIG. 1 and other figures. The method includes supplying 202, via a source external of the high-voltage asset and a non-conducting optical fiber link, optical power to a PD detector disposed within the high-voltage asset. The method involves converting 204, within the high-voltage asset, the optical power to a DC voltage. The method involves continuously biasing 206 a light emitter of the PD detector above a threshold value (current or voltage) using the DC voltage. The method also involves coupling 208 electrical disturbances indicative of a partial discharge from a high-voltage conductor of the high-voltage asset to the PD detector. The method involves generating 210, by the light emitter, a light signal indicative of the partial discharge. The method further involves communicating 212 the light signal to an electronic device external of the high-voltage asset via the non-conducting optical fiber link.

Figure 3:
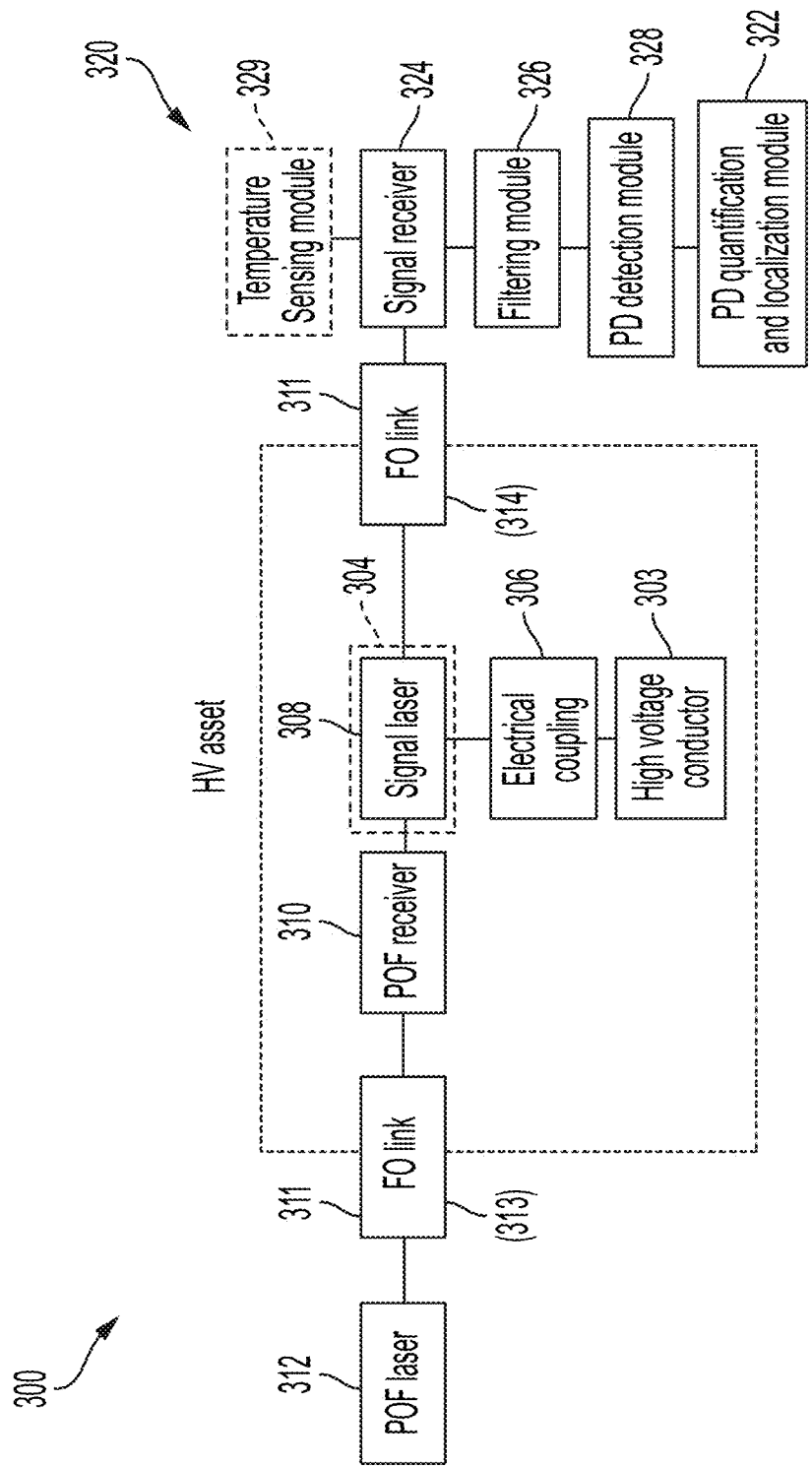
FIG. 3 illustrates a system for evaluating a high-voltage asset in accordance with various embodiments.

FIG. 3 illustrates a system for evaluating a high-voltage asset in accordance with various embodiments. The embodiment of system 300 shown in FIG. 3 can be implemented using power-over-fiber (POF) components. FIG. 3 shows a PD detector 304 comprising a signal laser 308 disposed in a high-voltage asset 302. The PD detector 304 includes, or is coupled to, an electrical coupling 306 situated in proximity to a high-voltage conductor 303 within the high-voltage asset 302. Situated externally of the high-voltage asset 302 is an external optical power source which includes a POF laser 312.

The POF laser 312 is optically coupled to a POF receiver 310 disposed within the high-voltage asset 302 via non-conducting fiber optic link 311. The POF receiver 310 is configured to convert optical power received via the fiber optic link 311 to DC power for biasing the signal laser 308 of the PD detector 304. In accordance with various embodiments, the POF receiver 310 provides DC power to the PD detector 304 for continuously biasing the signal laser 308 to a certain value above the threshold value of the laser diode. This enables the PD detector to be sensitive to positive and negative voltage fluctuations introduced by the PD events as well as sensitive to small PD events that would not be detectable with an unbiased signal laser 308. For example, if the laser threshold is 5 mA, then a PD below a certain value (e.g., 1 nC) would not drive the laser above threshold current, so the PD detector 304 is effectively "blind" to that particular PD. In summary, in such a configuration, the PD detector 304 is highly sensitive to partial discharge events that could not otherwise be detected with unbiased signal laser 308. For example, the PD detector 304 can be configured to detect a partial discharge having a charge of about 20 pC.

A light signal produced by the signal laser 308 is communicated to an electronic device 320 external of the high-voltage asset 302 via the fiber optic link 311. As was discussed previously, the fiber optic link 311 can be a common link or an arrangement of a first fiber optic link 313 and a second fiber optic link 314. The electronic device 320 includes a signal receiver 324 communicatively coupled to the fiber optic link 311 (e.g., the second fiber-optic link 314). The signal receiver 324 converts the light signal into a corresponding electrical signal which is processed by filtering circuitry 326, partial discharge detection circuitry 328, and partial discharge quantification and localization circuitry 322.

The electronic device 320 defines an optical detection and data acquisition system that receives partial discharge information as a light pulse transmitted over the fiber optic link 311 from the electrical-to-optical converter 108 (here represented by signal laser 308). The signal receiver 324 may comprise a photoreceiver based on a PIN photodiode, APD (avalanche photo diode), PMT (photo multiplier tube), SiPM (silicon photo multiplier) or other detector type. The detector should be sensitive to the wavelength of light generated by the signal laser 308. The detector may have a response time slower than the partial discharge duration such that only the time of onset and amplitude of a partial discharge can be detected. Suitable PD detection apparatuses and methods are disclosed in commonly-owned US Published Application Nos. 2020/0209288, 2020/0209301, and 2021/0123966, each of which is incorporated herein by references it its entirety. Alternatively, the detector may have a response time that is fast compared to the partial discharge duration such that the detailed temporal behavior of an individual partial discharge event is resolved.

The data analysis pipeline shown in FIG. 3 converts the raw signals measured by the optical detection and data acquisition system 320 to actionable information about the partial discharge state in the HV asset 302. The data analysis pipeline shown in FIG. 3 includes a signal receiver 324 (e.g., photoreceiver module), which can include signal conditioning and analog-to-digital (ADC) circuitry, a filtering module 326, a PD detection module 328 configured to trigger on PD events, and a quantification and localization module 322. In some implementations, the data analysis pipeline shown in FIG. 3 can include a PD detector temperature module 329 (see FIG. 10).

The pipeline starts with digitizing and prefiltering the signal from the photodetector of the signal receiver 324. The prefilter of the filtering module 326 may be an analog or digital bandpass filter with a pass band that matches the sensitivity band of the electrical coupling 306. This way, out-of-band noise is rejected. Another prefiltering approach is to calculate the signal entropy. Following filtering, a peak detection algorithm may be used to identify partial discharge events (via PD detection module 328) based on a threshold or prominence value. To quantify the partial discharge, the PD quantification and localization module 322 can be configured to use a calibration table that links the partial discharge amplitude in (V) measured with the optical detection system to the partial discharge size at the source in (pC). This calibration may be measured directly by injecting partial discharges at different points inside the HV asset 302 using a charge calibrator or through electromagnetic modeling, an example of which is discussed below with reference to FIG. 9.

Figure 7A:
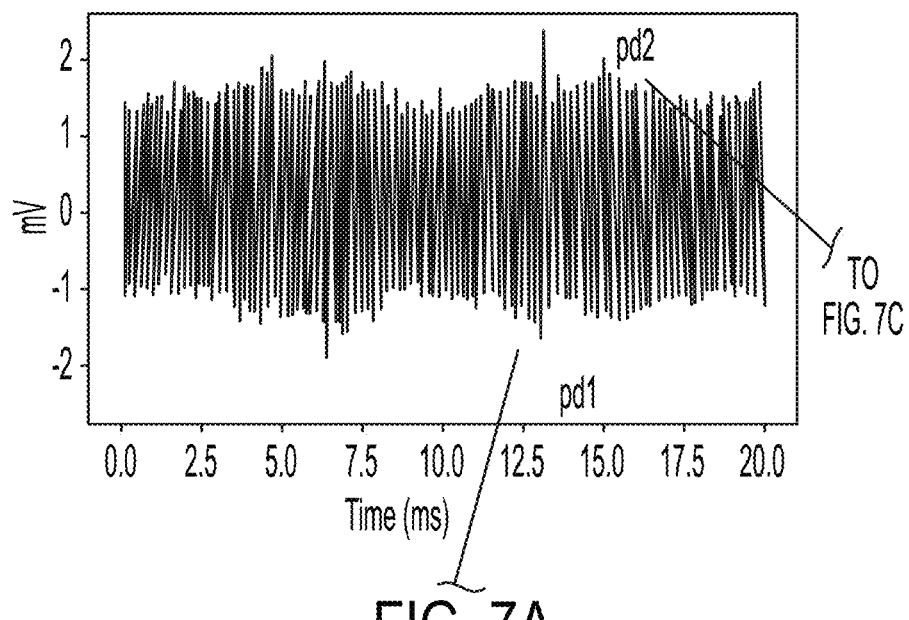
FIGS. 7A-7D illustrate representative output which can be generated by the data analysis pipeline shown in FIG. 3 in accordance with various embodiments.
Figure 7B:
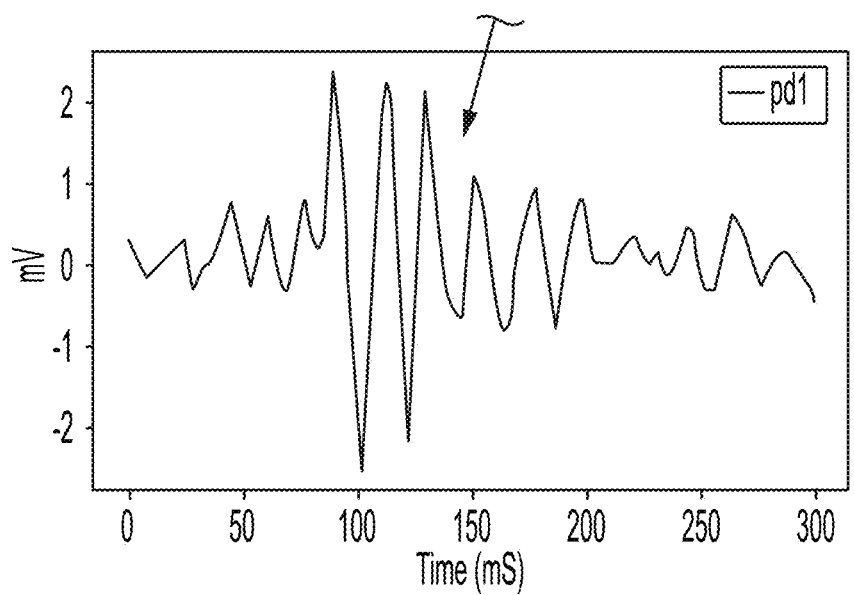
Figure 7C:
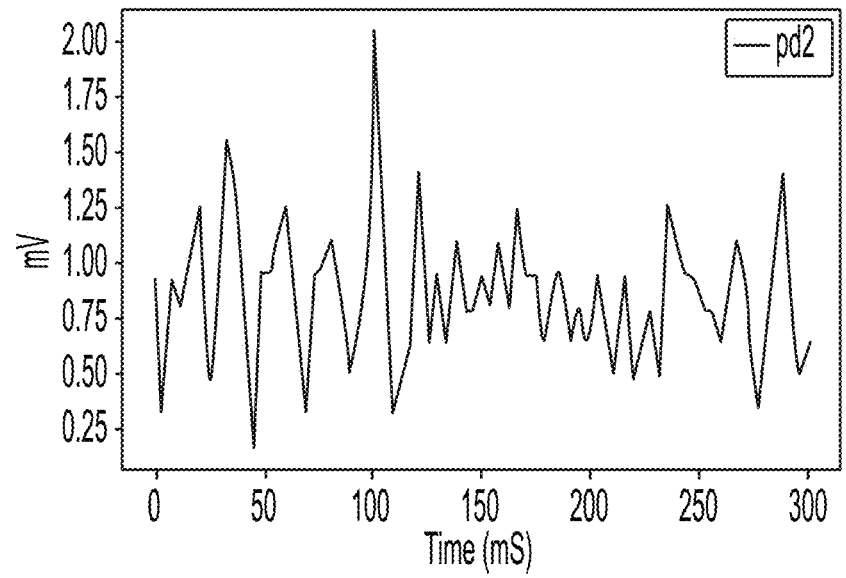
Figure 7D:
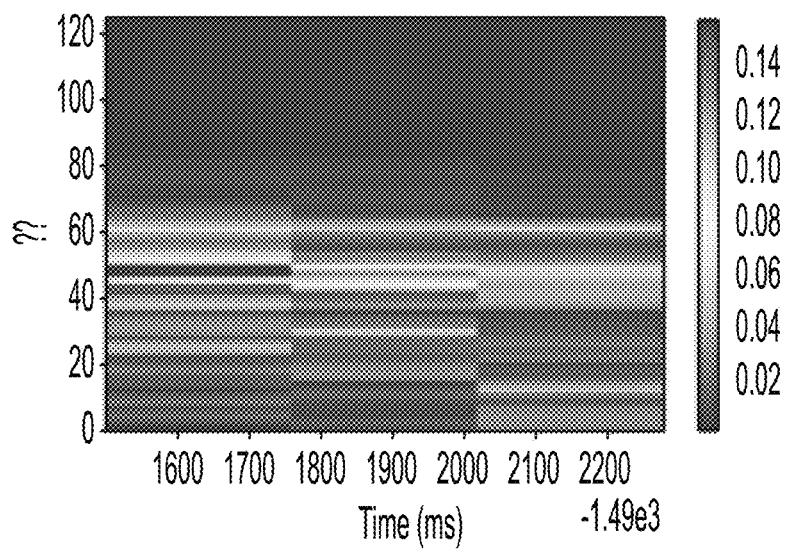

FIGS. 7A-7D illustrate representative output which can be generated by the data analysis pipeline shown in FIG. 3. FIG. 7A shows a representative light signal generated by two PD detectors, PD1 and PD2. FIGS. 7B and 7C are zoomed views of the light signals produced by PD detectors PD1 and PD2. FIG. 7D is a spectrogram developed from the data of FIG. 7A showing the signal concentrated around 60 MHz.

Figure 4:
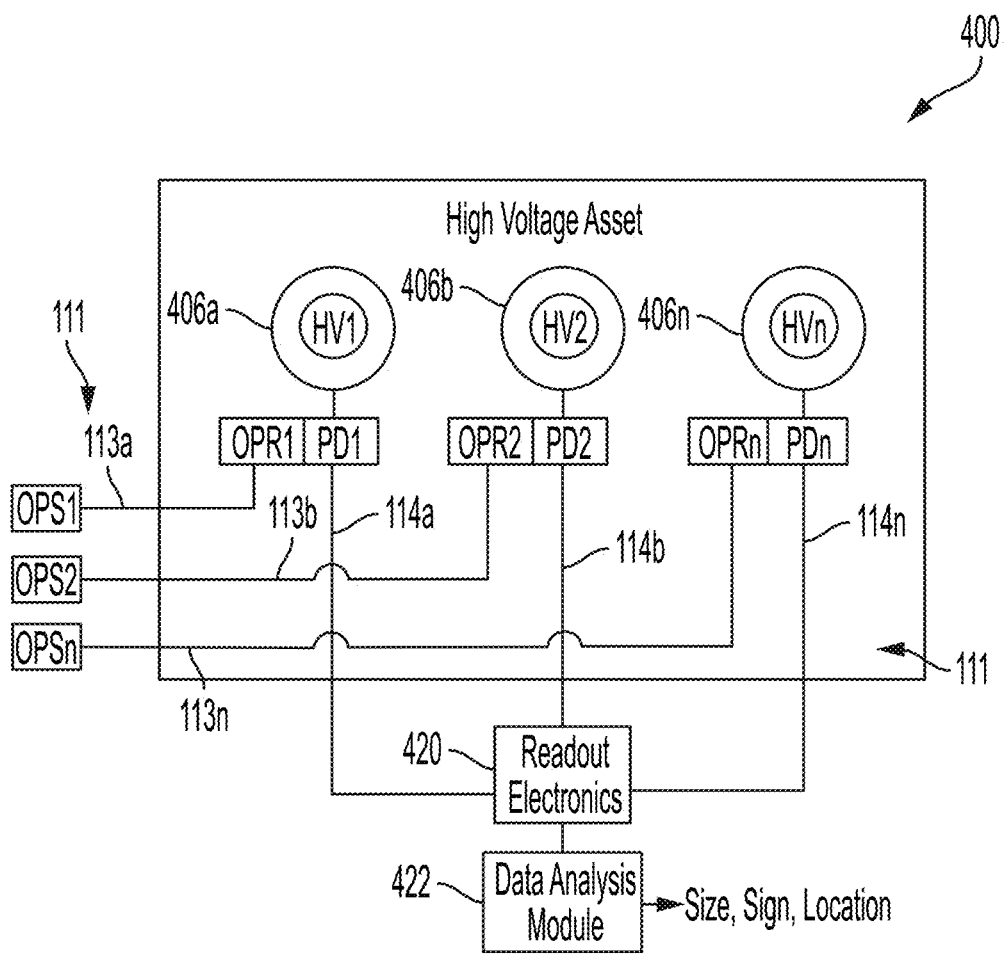
FIG. 4 illustrates a system for evaluating a high-voltage asset in accordance with various embodiments.

FIG. 4 illustrates a system for evaluating a high-voltage asset in accordance with various embodiments. The embodiment of system 400 shown in FIG. 4 includes a multiplicity of PD detectors, PD1, PD2, PDn, associated with a multiplicity of high-voltage conductors HV1, HV2, HVn. Each of the PD detectors, PD1, PD2, PDn, is operatively coupled to a corresponding optical power receiver OPR1, OPR2, or OPRn. Each of the optical power receivers OPR1, OPR2, or OPRn is operatively coupled to one of a multiplicity of optical power sources OPS1, OPS2, OPSn via a non-conducting fiber optic arrangement (shown as including fiber optic links 113a, 113b, 113n for convenience). It is noted that a single optical power source (e.g., OPS1) can be configured to supply optical power to multiple optical power receivers (e.g., OPS1, OPS2, OPSn) via the non-conducting fiber optic arrangement.

As is shown in FIG. 4, each of the PD detectors PD1, PD2, PDn is coupled to a separate optical link (one trunk per PD sensor). In some embodiments, two or more of the PD detectors PD1, PD2, PDn can share a common optical link (multiple PD sensors per trunk). The branch points can include WDM (wavelength division multiplexer) or 3 dB couplers, noting that the latter is lossy. In various embodiments, one or more Fiber Bragg grating (FBGs) can be disposed along one or more of the fiber optic links 113a-n and/or 114a-n. The FBGs can be implemented to provide sensing of temperature, strain, and/or vibration. Readout of the FBG sensor data can be multiplexed via WDM or 3 dB couplers.

The system 400 also includes a multiplicity of electrical couplers 406a, 406b, 4606n positioned proximate the multiplicity of high-voltage conductors HV1, HV2, HVn. For example, each of the electrical couplers 406a, 406b, 4606n can partially or entirely encircle one of the high-voltage conductors HV1, HV2, HVn. The electrical couplers 406a, 406b, 460n can be configured to capacitively couple, inductively couple or radiatively couple electrical disturbances indicative of a partial discharge from the high-voltage conductors HV1, HV2, HVn to a corresponding PD detector PD1, PD2, PDn. In various implementations, the electrical couplers 406a, 406b, 460n can comprise, for example, a wire wrap, a wire coil, a Rogowski coil or a high frequency current transformer.

For example, for a capacitive coupling to a high voltage cable, a cylindrical conductor such as a wire wrap or metal tube can provide the coupling. For an inductive coupling to the same cable, a toroidal inductor may be used such as a Rogowski coil or high frequency current transformer (HFCT). An advantage of the Rogowski coil is that it can be slipped over the cable from the side without altering the existing cable topology. This may be desirable for retrofits where it is undesirable to uncouple any electrical connections. For a radiative coupling, the antenna geometry determines the directionality of the coupling. An omnidirectional antenna is sensitive to PD originating from any direction within the transformer, while a directional antenna is sensitive to PD from a certain set of directions only. In all cases, the coupling should have a high coupling efficiency for the frequency band of interest for PD sensing: 10 MHz-1 GHz and a low but finite coupling efficiency for the 60 Hz frequency band. The 60 Hz coupling should be small enough so that it does not saturate the detection system and large enough to provide a phase reference signal used to determine the phase of the measured PD.

As is also shown in FIG. 4, each of the PD detectors, PD1, PD2, PDn is operatively coupled to readout electronics 420. The readout electronics 420 typically includes a signal receiver, filtering circuitry, and PD detection circuitry, such as that shown in FIG. 3. A data analysis module 422, which can include to PD quantification and localization circuitry shown in FIG. 3, is operatively coupled to the readout electronics 420, and is configured to produce various output data including the size, sign, and location of a PD event as previously discussed. For example, the system can include a data communication module configured to transport data to a remote server for analysis or an edge device coupled to the optical readout.

FIG. 5A illustrates details of a PD detector in accordance with various embodiments. The PD detector 504 shown in FIG. 5A includes components of an optical power receiver 510 together with components of an electrical-to-optical converter 508. The optical power receiver 510 includes one or more photovoltaic cells 530 configured to receive optical power from an external optical power source via a non-conducting fiber optic link (shown as first optical fiber 513 for convenience). Multiple photovoltaic cells 530 can be connected in series as shown. The anode of photovoltaic cell 530 is coupled to an inductor 532, which directs the PD-induced electrical fluctuations preferentially towards the laser diode and not to the photovoltaic cells. The electrical-to-optical converter 508 includes a light source, here represented by a laser diode 540 having an anode coupled to a current limiting resistor 534. An electrical coupler 506 (depicted as a capacitor) is connected at a location between the inductor/choke 532 and the resistor 534.

In this configuration, the photovoltaic cells 530 generate DC power to bias the laser diode 540 above its threshold current on a continuous basis. As such, the laser diode 540 is always emitting light. The DC power generated by the photovoltaic cells 530 is also used by signal amplification and light signal encoding circuitry of the PD detector 504. It is noted that, in some embodiments, an energy harvesting arrangement (e.g., a small coil in combination with a rectifier) can be implemented (alone or in combination with photovoltaic cells 530) to harvest energy from the HV asset itself for biasing the laser diode 540, signal amplification, and encoding the output light signal with a PD event pulse. The signal encoding circuitry can be configured to perform direct analog encoding, pulse width modulation (PWM), amplitude modulation (AM), or frequency modulation (FM) of the output light signal with a PD event pulse.

The continuous supply of DC bias voltage to the laser diode 540 allows for the continuous monitoring of partial discharge events within the high-voltage asset. As is shown in FIG. 5A, a partial discharge is coupled to the PD detector circuitry via the electrical coupler 506, which is converted to a light signal by the laser diode 540. The light signal is communicated out of the high-voltage asset to an external electronic device via the non-conducting fiber optic link (shown as second optical fiber 514 for convenience) as previously described.

Figure 5B:
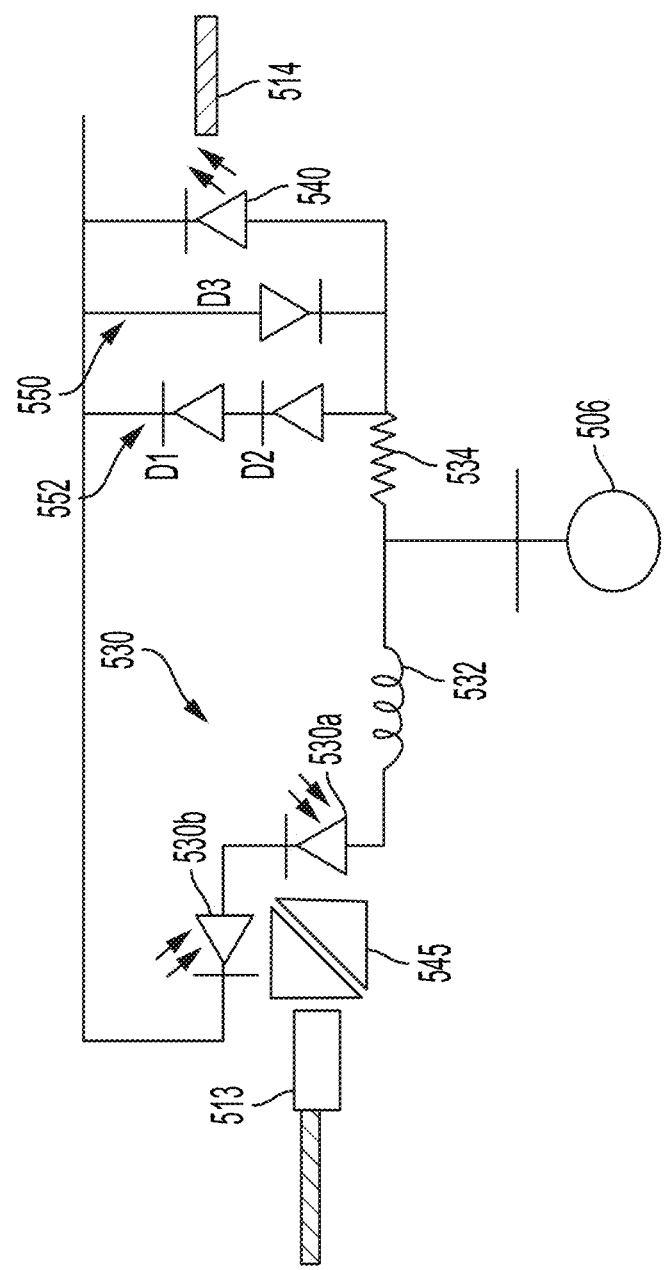
FIG. 5B illustrates details of a PD detector in accordance with various embodiments.

FIG. 5B illustrates details of the PD detector in accordance with various embodiments. The circuitry shown in FIG. 5B is similar to that shown in FIG. 5A but includes additional components. In FIG. 5B, the first optical fiber 513 is optically coupled to a beamsplitter 545 (e.g., via a 2.5 mm ferrule) configured to split light received from the first optical fiber 513 onto first and second photovoltaic cells 530a, 530b to produce a forward bias voltage. A current limiting resistor 534 is configured to cause current to flow through the laser diode 540 causing the laser diode 542 emit light. A partial discharge excitation on the electrical coupler 506 modulates the current flowing to the laser diode 540 thereby generating a light pulse, which is communicated to an external electronic device via the second optical fiber 514.

The PD device circuitry shown in FIG. 5B includes a high-voltage protection circuit 550 coupled to the laser diode 540. The high-voltage protection circuit 550 includes a forward bias protection circuit 552, which includes diodes D1 and D2, and a reverse bias protection circuit 554, which includes diode D3. The high-voltage protection circuit 550 is configured to cause a response of the laser diode current to become sub-linear (or have a log response), such that proportionally more current flows through the forward bias protection circuit 552 in response to partial discharges of increasing electric charge. This sub-linear response can increase the dynamic range of the PD detection system, which is valuable because the desired dynamic range for PD detection may be very wide, 30 dB or more. Another way to achieve a wide dynamic range is with a log amplifier in the electrical-to-optical conversion stage.

According to an illustrative embodiment, 980 nm, 500 mW power-over-fiber light is delivered via an optical fiber connection, such as a 2.5 mm ferrule. This light is split using the beamsplitter 545 onto two Si photovoltaic cells 530 wired in series to give a forward voltage of $V\_f \approx 1$ V DC. Current-limiting resistor 534 defines the current I_DC flowing through a 1550 nm fiber coupled laser diode 540, causing it to emit light at DC. A PD excitation on the electrical coupling 506 modulates the current to the laser diode 540, generating a light pulse. A choke 532 ensures that the full current from the PD excitation goes to laser diode 540. Reverse protection diode D3 prevents the laser diode 540 from being reverse biased, and forward protection diodes D1 and D2 shunt current away from the laser diode 540 for large forward voltages. In the embodiments shown in FIGS. 5A and 5B, a power management system consisting of a DC/DC conversion stage may be present and implemented with a low-cost IC or microcontroller.

It is desirable that the laser diode 540 be designed for high temperature and for operation over a significant timeframe. In some implementations, standard laser diodes can be used. For example, standard 1550 nm telecom lasers operate up to 85° C. and survive to 100° C., which is sufficient in many applications. In other implementations involving higher operating temperatures, specialty laser diodes can be used, such as high-temperature 850 nm VCSELS or 1330 nm lasers. If desired, also a TEC (thermoelectric cooler) cooled laser diode could be used but, in this case, additional power for the TEC cooler needs to be provided from the POF system or harvested from the HV asset by other means as discussed above.

Figure 6:
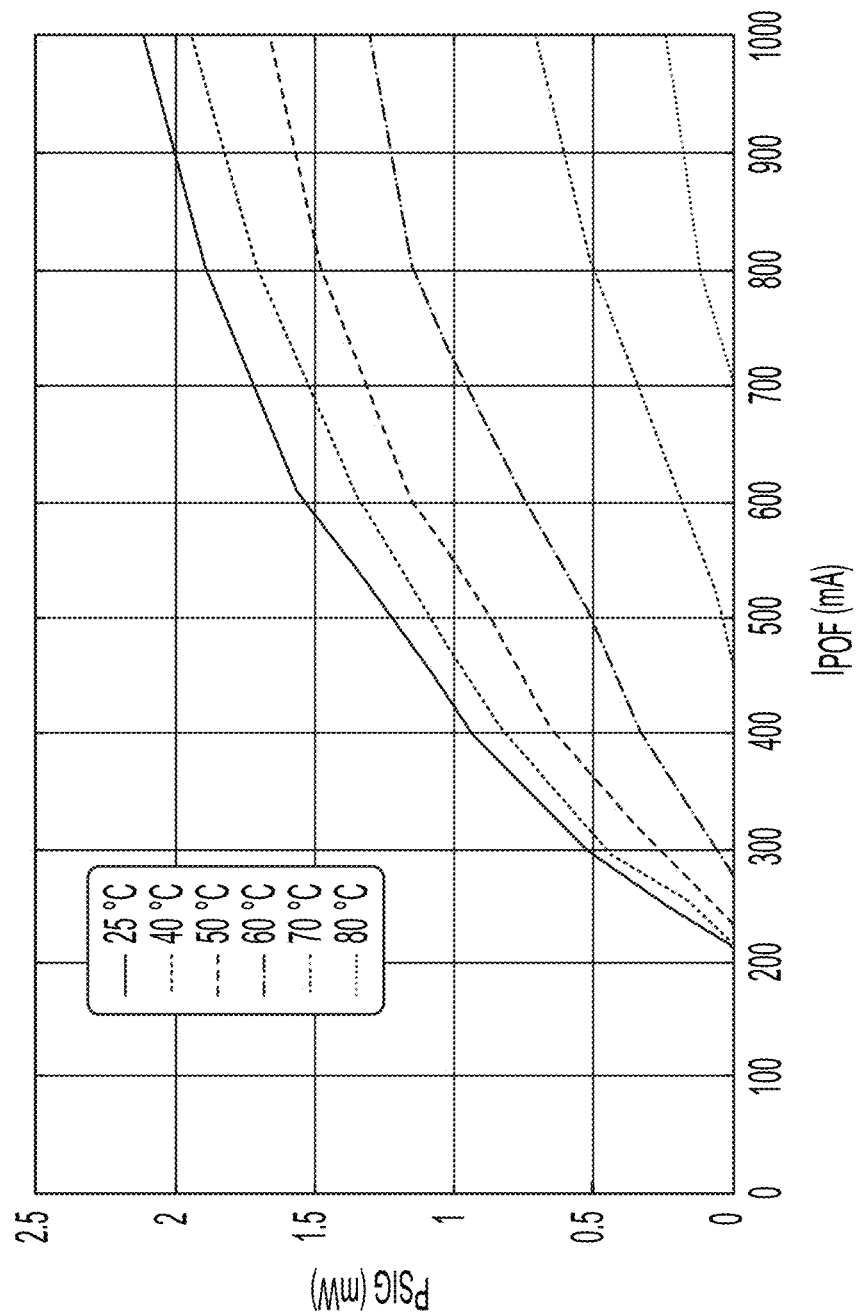
FIG. 6 shows power from a signal laser as a function of power-over-fiber laser drive current for the system shown in FIG. 5B in accordance with various embodiments.

FIG. 6 shows the power from a signal laser as a function of the power-over-fiber laser drive current for the system from FIG. 5B at various temperatures from 25-80° C. The threshold for the signal laser shifts towards higher drive currents at higher temperatures, but the signal laser can nevertheless be biased above threshold (for high PD detection sensitivity) for temperatures up to 80° C. It is noted that the fiber cables and associated coatings need to withstand these conditions and be able to hold a vacuum during the HV asset assembly process. Suitable optical fibers include Polyimide or PEEK coated fibers.

An advantageous aspect of some embodiments involves using a network of PD detectors inside a HV asset to measure the same partial discharge by multiple PD detectors. Deployment of multiple PD detectors within an HV asset facilitates the localization of a partial discharge to a specific element such as a high voltage phase, a specific section of insulation, or a high voltage bushing, for example. Embodiments of the disclosure provide for localizing a partial discharge to an area smaller than 3 $m^2$ (e.g., 1 $m^2$, 1.5 $m^2$, 2 $m^2$, 2.5 $m^2$). Since disturbances in the electrical grid can back-propagate inside a transformer, another aspect of localization can determine if an anomaly originates from inside or outside the transformer. For this purpose, some of the PD detectors need to be positioned inside the HV asset to avoid the metal walls and other structures screening, and interfering with, an accurate PD localization. This is particularly important for UHF band radiated fields. One or more PD detectors can be positioned outside of the HV asset, such as on high voltage bushings or nearby HV transmission cables.

Figure 8:
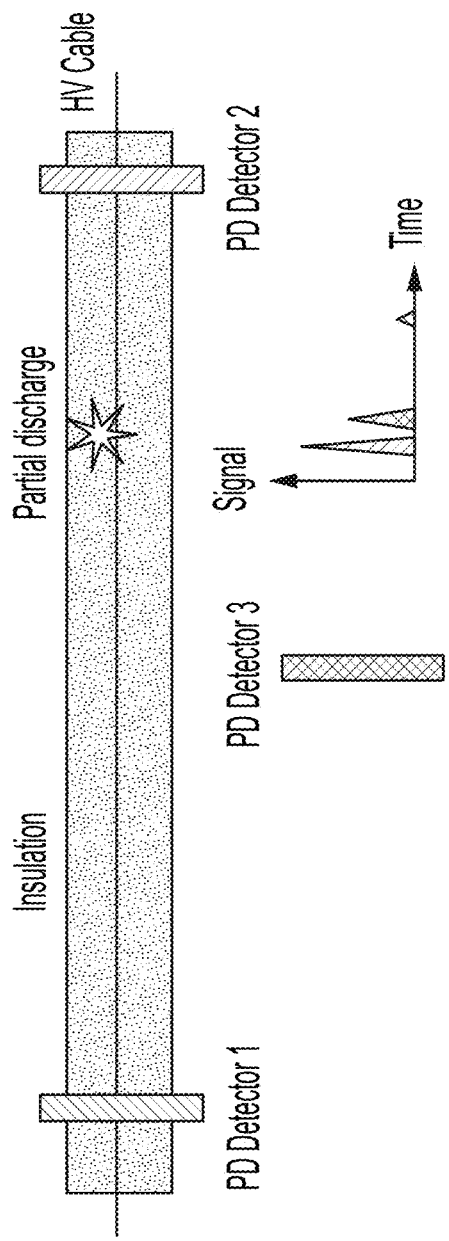
FIG. 8 illustrates an amplitude-based method of partial discharge localization in accordance with various embodiments.

Various methods of partial discharge localization can be used, including amplitude-based methods such as triangulation using the PD amplitudes measured at different locations. FIG. 8 illustrates one such amplitude-based method of partial discharge localization, in which the location of the partial discharge is determined based on the relative amplitude of the PD signal at each of the PD detectors (shown as PD Detector 1, PD Detector 2, PD Detector 3). An alternative method for localization is to use the propagation delay to pinpoint the source of PD base on time of flight (ToF) of the radiated UHF fields, as is also shown in FIG. 8. It is noted that this method requires high speed electronics with the ability to measure sub-ns time shifts.

Figure 9:
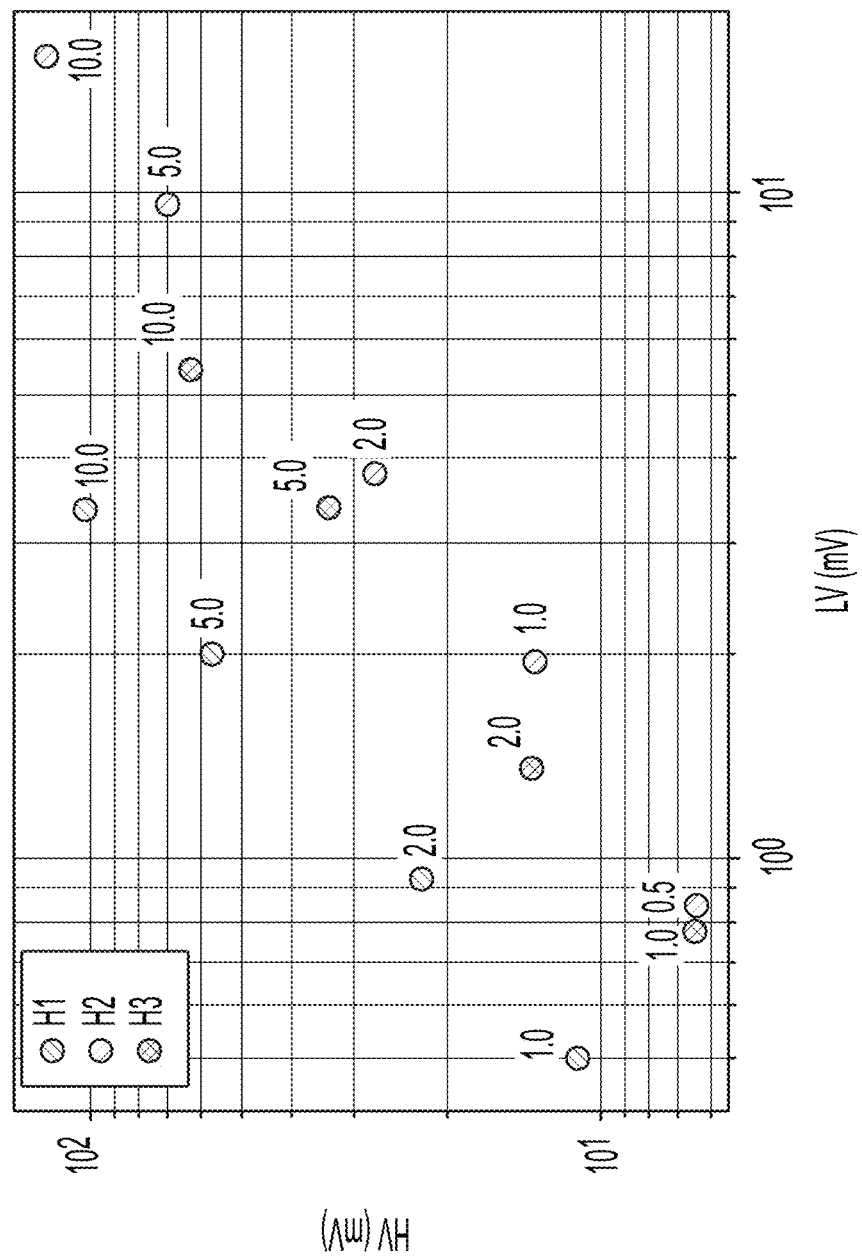
FIG. 9 shows data used for localizing a partial discharge from within an HV asset in accordance with various embodiments.

To quantify and localize a partial discharge, FIG. 9 shows the signal in mV measured on two PD sensors HV and LV (one PD sensor coupling PD induced voltage fluctuations at a high voltage location and one PD sensor coupling PD induced voltage fluctuations near a low voltage location) from a PD excited on high voltage conductors H1, H2, and H3 of different phases using a charge calibrator. In FIG. 9, the PD size in nC is indicated by the annotations for each data point. The trend lines for the PD excited on conductors H1, H2, and H3 are well separated. Thus, a PD may be quantified and localized to a particular high voltage phase based on the relative signal measured on the HV and LV PD detectors. The localization can be improved by making the electrical coupling more specific to disturbances originating on a given phase. Other ways to improve the localization and implement noise mitigation is to add more PD sensors and PD sensor locations to reduce the noise of sensor measurement.

Another way to improve localization is to improve the fidelity of the clusters/trend lines of the type in FIG. 9. For example, this could be done by exciting a PD at known points in the transformer or on known electrical phases (as in FIG. 9), in which case improvements would come from e.g., a denser spatial sampling of PD excitation points. Alternatively, the clusters could be estimated without opening the HV asset by using electromagnetic simulation tools, in which case improvements to the fidelity of the simulation would result in improved localization. Besides multiple sensors, combining multiple measurement types e.g. amplitude, time delay, phase, pattern, PD shape, and even other sensor data (e.g. vibration) can provide better localization of the PD source than any one measurement type. Machine learning may be helpful in identifying patterns among all these data streams.

In some embodiments, the location of a PD can be determined using a single PD detector. For example, the location of a PD can be determined using the temporal shape or morphology of a PD light signal envelop together with knowledge as to which quadrant in the 50 of 60 Hz cycle the PD has occurred.

Figure 10:
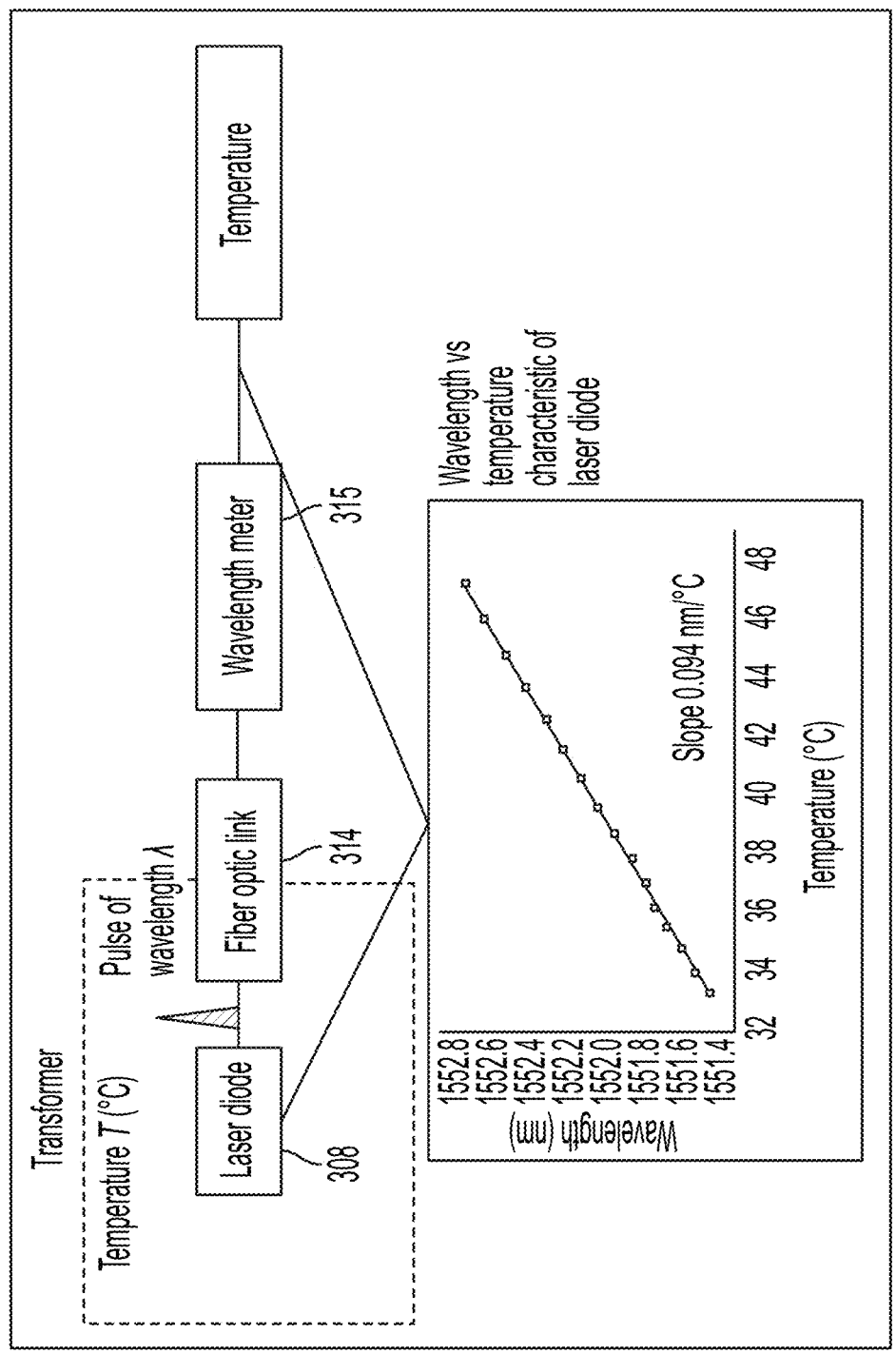
FIG. 10 shows an apparatus for determining temperature at a PD detector using a wavelength of the laser diode of the PD detector in accordance with various embodiments.

According to some embodiments, and with reference to FIG. 10, the external electronic device 320 shown in FIG. 3 can be configured to determine temperature at a PD detector using a wavelength of the laser diode 308. The laser diode 308 has a wavelength vs temperature characteristic, which is typically a line with a slope of around 0.1 nm/K. Thus, if the wavelength is measured via wavelength meter 315, the temperature at the location of the laser diode can be determined. With 0.1 nm wavelength resolution, a temperature resolution of 1 K can be obtained, which is sufficient for this application. Various known techniques can be used to implement the wavelength meter 315, and a 0.1 nm resolution is not a demanding specification.

Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

All references and publications cited herein are expressly incorporated herein by reference in their entirety into this disclosure, except to the extent they may directly contradict this disclosure. Unless otherwise indicated, all numbers expressing feature sizes, amounts, and physical properties used in the specification and claims may be understood as being modified either by the term "exactly" or "about." Accordingly, unless indicated to the contrary, the numerical parameters set forth in the foregoing specification and attached claims are approximations that can vary depending upon the desired properties sought to be obtained by those skilled in the art utilizing the teachings disclosed herein or, for example, within typical ranges of experimental error.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality (for example, a radio chip may be operably coupled to an antenna element to provide a radio frequency electric signal for wireless communication).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," "comprise," "comprising" or the like are used in their open-ended sense, and generally mean "including, but not limited to." It will be understood that "consisting essentially of" "consisting of," and the like are subsumed in "comprising," and the like. The term "and/or" means one or all of the listed elements or a combination of at least two of the listed elements.

The phrases "at least one of," "comprises at least one of," and "one or more of" followed by a list refers to any one of the items in the list and any combination of two or more items in the list.

The invention claimed is:

1. A system for evaluating a high voltage (HV) asset, comprising:
   a partial discharge (PD) detector disposed in the HV asset and comprising:
      an electrical coupler configured to couple electrical disturbances indicative of a partial discharge from a high voltage conductor of the HV asset to an electrical-to-optical converter; and
      the electrical-to-optical converter comprising a light emitter and configured to convert the electrical disturbances to a light signal;
   an optical power receiver disposed in the HV asset and coupled to the PD detector, the optical power receiver configured to receive optical power from an external optical power source via a non-conducting optical fiber arrangement; and
   the electrical-to-optical converter configured to communicate the light signal indicative of the partial discharge to an electronic device external of HV asset via the non-conducting optical fiber arrangement.

2. The system of claim 1, wherein the light emitter comprises a light emitting diode or a laser diode.

3. The system of claim 1, wherein the optical power receiver is configured to provide continuous power to the PD detector using the optical power received from the external optical power source.

4. The system of claim 1, wherein the light emitter is continuously biased above a threshold value by the optical power receiver.

5. The system of claim 1, wherein the electrical-to-optical converter comprises:
   a laser diode; and
   a high voltage protection circuit coupled to the laser diode and comprising a forward bias protection circuit and a reverse bias protection circuit.

6. The system of claim 5, wherein the high voltage protect circuit is configured to cause a response of the laser diode to current to become sub-linear.

7. The system of claim 1, wherein the electrical-to-optical converter comprises an encoder configured to encode the electrical disturbances indicative of the partial discharge on the light signal in an analog format or a digital format.

8. The system of claim 1, wherein:
   the optical power receiver comprises one or more photovoltaic cells configured to receive optical power from an external optical power source; and
   the one or more photovoltaic cells are configured to generate a DC voltage for continuously biasing the light emitter above a threshold value.

9. The system of claim 1, wherein the non-conducting optical fiber arrangement comprises or supports one or more sensors.

10. The system of claim 9, wherein the one or more sensors comprises one or more of a temperature sensor, a strain sensor, and a vibration sensor.

11. The system of claim 1, wherein:
   the light emitter comprises a laser diode; and
   the external device is configured to determine temperature at the PD detector using a wavelength of the laser diode.

12. The system of claim 1, wherein the external device is configured to quantify a magnitude and a sign of the partial discharge using the light signal.

13. The system of claim 1, wherein the external device is configured to determine a location of a detected partial discharge within the HV asset using light signals produced by the PD detector.

14. The system of claim 1, wherein:
the systems comprises two or more of the PD detectors; and
the external device is configured to determine a location of a detected partial discharge within the HV asset using light signals produced by the two or more PD detectors.

15. The system of claim 13, wherein the external device is configured to identify the location of the detected partial discharge relative to one or more phases of an output voltage of the HV asset.

16. The system of claim 1, wherein:
the systems comprises two or more of the PD detectors situated within the HV asset and at least one PD detector situated outside of the HV asset; and
the external device is configured to determine whether a location of a detected partial discharge is within or outside of the HV asset using light signals produced by the two or more PD detectors.

17. The system of claim 1, wherein the electrical coupler is configured to one of capacitively couple, inductively couple, and radiatively couple electrical disturbances indicative of the partial discharge from the high voltage conductor of the HV asset to the electrical-to-optical converter.

18. A system for evaluating a high voltage (HV) asset, comprising:
a partial discharge (PD) detector disposed in the HV asset and comprising:
an electrical coupler configured to couple electrical disturbances indicative of a partial discharge from a high voltage conductor of the HV asset to an electrical-to-optical converter; and
the electrical-to-optical converter comprising a light emitter and configured to convert the electrical disturbances to a light signal;
a power source disposed in the HV asset and coupled to the PD detector, the power source devoid of an electrical conductor that extends out of the HV asset; and
the electrical-to-optical converter configured to communicate the light signal indicative of the partial discharge to an electronic device external of HV asset via a non-conducting optical fiber arrangement.

19. The system of claim 18, wherein the power source comprises an energy harvesting arrangement configured to harvest energy from the HV asset itself.

20. The system of claim 18, wherein the power source comprises an optical power receiver disposed in the HV asset and coupled to the PD detector, the optical power receiver configured to receive optical power from an external optical power source via the non-conducting optical fiber arrangement.

21. A method for use with a high voltage (HV) asset, the method comprising:
supplying, via a source external of the HV asset and a non-conducting optical fiber arrangement, optical power to a partial discharge (PD) detector disclosed in the HV asset;
converting, within the HV asset, the optical power to a DC voltage;
continuously biasing a light emitter of the PD detector above a threshold value using the DC voltage;
coupling electrical disturbances indicative of a partial discharge from a high voltage conductor of the HV asset to the PD detector;
generating, by the light emitter, a light signal indicative of the partial discharge; and
communicating the light signal to an electronic device external of HV asset via the non-conducting optical fiber arrangement.

22. The method of claim 21, comprising converting, within the HV asset, the optical power to the DC voltage using one or more photovoltaic cells.

23. The method of claim 21, comprising quantify a magnitude of the partial discharge using the light signal.

24. The method of claim 21, comprising determining a location of the partial discharge using light signals produced by two or more of the PD detectors disposed at different locations within the HV asset.

25. The method of claim 24, comprising determining the location of the partial discharge relative to one or more phases of an output voltage of the HV asset.

26. The method of claim 21, comprising determining a location of the partial discharge using light signals produced by two or more of the PD detectors disposed at different locations within the HV asset and at least one PD detector situated outside of the HV asset.

* * * * *